US006727786B2

(12) United States Patent
Toncich

(10) Patent No.: US 6,727,786 B2
(45) Date of Patent: Apr. 27, 2004

(54) BAND SWITCHABLE FILTER

(75) Inventor: Stanley S. Toncich, San Diego, CA (US)

(73) Assignee: Kyocera Wireless Corporation, San Diego, CA (US)

(*) Notice: Subject to any disclaimer, the term of this patent is extended or adjusted under 35 U.S.C. 154(b) by 0 days.

(21) Appl. No.: 10/120,646

(22) Filed: Apr. 10, 2002

(65) Prior Publication Data

US 2003/0062971 A1 Apr. 3, 2003

Related U.S. Application Data

(60) Provisional application No. 60/283,093, filed on Apr. 11, 2001.

(51) Int. Cl.[7] .............................. H01P 7/00; H01P 1/11
(52) U.S. Cl. ..................... 333/219.2; 333/174; 333/205
(58) Field of Search ................ 333/101, 105, 333/132, 202, 205, 209, 262, 174, 219.2

(56) References Cited

U.S. PATENT DOCUMENTS

| 3,413,543 A | 11/1968 | Schubring et al. |
| 3,676,803 A | 7/1972 | Simmons |
| 3,678,305 A | 7/1972 | Paige |
| 3,836,874 A | 9/1974 | Maeda et al. |
| 3,918,012 A | 11/1975 | Peuzin |
| 4,475,108 A | 10/1984 | Moser |
| 4,733,328 A | 3/1988 | Blazej |
| 4,799,066 A | 1/1989 | Deacon |
| 4,835,499 A | 5/1989 | Pickett |
| 5,166,857 A | 11/1992 | Avanic et al. |
| 5,212,463 A | 5/1993 | Babbitt et al. |
| 5,216,392 A | 6/1993 | Fraser et al. |
| 5,227,748 A | * 7/1993 | Sroka ................... 333/207 |
| 5,307,033 A | 4/1994 | Koscica et al. |

(List continued on next page.)

FOREIGN PATENT DOCUMENTS

| DE | 40 36 866 A1 | 7/1991 |
| EP | 0 637 131 A1 | 2/1995 |
| EP | 0 638 953 A1 | 2/1995 |
| EP | 0 680 108 A1 | 4/1995 |
| EP | 0 795 922 A1 | 9/1997 |
| EP | 0 843 374 A2 | 5/1998 |
| EP | 0 881 700 A1 | 5/1998 |
| EP | 0 909 024 A2 | 4/1999 |
| EP | 1 043 741 A2 | 10/2000 |
| JP | 2001338839 | 12/2001 |
| WO | WO 94/13028 | 6/1994 |
| WO | WO 00/28613 | 5/2000 |
| WO | WO 00/35042 | 6/2000 |
| WO | WO 00/62367 | 10/2000 |
| WO | WO 00 79645 A1 | 12/2000 |
| WO | WO 00/79648 A1 | 12/2000 |

OTHER PUBLICATIONS

A. Presser, "Varactor–Tunable. High–Q Microwave Filter." RCA Review. vol. 42, Dec. 1981, pp. 691–705.

C. Chang and T. Itoh. "Microwave Active Filters Based on Coupled Negative Resistance Method." IEEE Transactions on Microwave Theory and Techniques. Vol 38, No. 12. Dec. 1990, pp. 1879–1884.

(List continued on next page.)

Primary Examiner—Robert Pascal
Assistant Examiner—Dean Takaoka
(74) Attorney, Agent, or Firm—Procopio, Cory, Hargreaves & Savitch

(57) ABSTRACT

A ferro-electric filter and method of tuning same. The filter includes a switch for switching between quarter wave resonator and half wave resonator modes. The filter also includes a ferro-electric component for tuning the resonant frequency. The method includes applying a switching control signal to the switch for switching between resonant frequencies and applying a tuning control signal for tuning the resonant frequency.

3 Claims, 7 Drawing Sheets

U.S. PATENT DOCUMENTS

| | | | |
|---|---|---|---|
| 5,427,988 A | 6/1995 | Sengupta et al. | |
| 5,450,092 A | 9/1995 | Das | |
| 5,472,935 A | 12/1995 | Yandrofski et al. | |
| 5,496,795 A | 3/1996 | Das | |
| 5,557,286 A | 9/1996 | Varadan et al. | |
| 5,561,407 A | 10/1996 | Koscica et al. | |
| 5,589,845 A | 12/1996 | Yandrofski et al. | |
| 5,617,104 A | 4/1997 | Das | |
| 5,640,042 A | 6/1997 | Koscica et al. | |
| 5,729,239 A | 3/1998 | Rao | |
| 5,777,524 A | 7/1998 | Wojewoda et al. | |
| 5,778,308 A | 7/1998 | Sroka et al. | |
| 5,880,921 A | 3/1999 | Tham et al. | |
| 5,945,887 A | 8/1999 | Makino et al. | |
| 5,973,567 A | 10/1999 | Heal et al. | |
| 5,973,568 A | 10/1999 | Shapiro et al. | |
| 5,987,314 A | 11/1999 | Saito | |
| 6,018,282 A * | 1/2000 | Tsuda | 333/205 |
| 6,049,726 A | 4/2000 | Gruenwald et al. | |
| 6,052,036 A | 4/2000 | Enstrom et al. | |
| 6,097,263 A | 8/2000 | Mueller et al. | |
| 6,160,524 A | 12/2000 | Wilber | |
| 6,198,441 B1 | 3/2001 | Okabe et al. | |
| 6,292,143 B1 | 9/2001 | Romanofsky | |
| 6,333,719 B1 | 12/2001 | Varadan et al. | |
| 6,404,304 B1 * | 6/2002 | Kwon et al. | 333/202 |
| 6,522,220 B2 * | 2/2003 | Yamada et al. | 333/134 |

OTHER PUBLICATIONS

P. Katzin, B. Bedard. Y. Ayasli, "Narrow–Band MMIC Filters with Automatic Tuning and Q–Factor Control." 1993 IEEE MTT–S Digest pp. 403–406.

B. Hopf. I. Wolff, M. Guglielmi. "Coplanar MMIC Active Bandpass Filters Using Negative Resistance Circuits." 1994 IEEE MTT–S Digest pp. 1183–1185.

U. Karacaoglu and I. O. Robertson, "High Selectivity Varactor–Tuned MMIC Bandpass Filter Using Lossless Active Resonators." 1994 IEEE MTT–S Digest, pp. 1191–1194.

B. Nauta. "A CMOS Transconductance–C Filter Technique for Very High Frequencies." IEEE Journal of Solid–State Circuits, vol. 27, No. 2, Feb. 1992, pp. 142–153.

K. Fujita, H. Itoh, R. Yamamoto, "A 15.6 GHz Commercially Based 1/8 GaAs Dynamic Prescaler." 1989 IEEE GaAs IC Symposium, pp. 113–116.

J. Smuk, P. Katzin, "MMIC Phase Locked L–S Band Oscillators." 1994 GaAs IC Symposium Digest, pp. 27–29.

S. R. Chandler, I. C. Hunter, J. G. Gardiner, "Active Varactor Tunable Bandpass Filter," IEEE Microwave and Guided Wave Letters. vol. 3, No. 3, Mar. 1993.

I. C. Hunter, J. D. Rhodes. "Electronically Tunable Microwave Bandpass Filters," IEEE Transactions on Microwave Theory and Techniques. vol. MTT–30, No. 9, Sep. 1982, pp. 1354–1367.

S. Toyoda, "Quater–Wavelength Coupled Variable Bandstop and Bandpass Filter Using Varactor Diodes." IEEE Transactions on Microwave Theory and Techniques, vol. MTT–30, No. 9, Sep. 1982, pp. 1387–1389.

B. Yu Kapilevich, "Variety of Approaches to Designing Microwave Active Filters." Proc. 27th European Microwave Conf. Jeruselem, vol. 1, 1997, pp. 397–408.

B. Kapilevich, "Understand the Operation of Channelized Active Filters, "Microwaves & RF, Jan. 1997, pp. 89–92.

M. Dishali, "Alignment and Adjustment of Synchronously Tuned Multiple–Resonant–Circuit Filters," Proceedings of the IRE 39, Nov. 1951, pp. 1448–1455.

S. Cohn, "Dissipation Loss in Multiple–Coupled–Resonator Filters," Proceedings of the IRE 47, Aug. 1959, pp. 1342–1348.

G. L. Matthaei, "An Electronically Tunable Up–Convertor," Proceedings of the IRE 49, Nov. 1961, pp. 1703–1704.

E. G. Fubin, E. A. Guillermin, "Minimum Insertion Loss Filters," Proceedings of the IRE 47, Jan. 1959, pp. 37–41.

W. J. Getsinger, "Prototypes for Use in Broadbanding Reflection Amplifiers," IEEE Transactions on Microwave Theory and Techniques, PTGMTT–11, Nov. 1963, pp. 486–497.

E. S. Kuh, M. Fukada, "Optimum Synthesis of Wide–Band Parametric Amplifiers and Converters," IRE Transactions on Circuit Theory, PCCT–8, Dec. 1961, pp. 410–415.

W. J. Getsinger, G. L. Matthaei, "Some Aspects of the Design of Wide–Band Up–Converters and Nondegenerate Parametric Amplifiers," IEEE Transactions on Microwave Theory and Techniques, pp 77–87. PTGMTT–12, Jan. 1964.

R. L. Sleven, "Design of a Tunable Multi–Cavity Waveguide Band–Pass Filter," 1959 IRE National Convention Record, Part 3, pp. 91–112.

J. J. Taub, B. F. Bodner, "Design of Three–Resonator Dissipative Band–Pass Filters Having Minimum Insertion Loss," Proceedings of the IRE 45, May 1957, pp. 681–687.

K L Kotzebue, "Broadhand Electronically–Tuned Microwave Filters," 1960 IRE Westcon Convention Record, Part 1, pp. 21–27.

J. P. Louhos, J. Pankinaho, "Electrical Tuning of Integrated Mobile Phone Antennas," Nokia Mobile Phones, Sep. 15, 1999, pp. 69–97.

P. K. Panayi, M. Al–Nauimi, L. P. Ivrissimtzis, "Tuning Techniques for the Planar Inverted–F Antenna," National Conference on Antennas and Propagation Publication, No. 461, Apr. 1999, pp. 259–262.

Satoshi Makioka et al., "A High Efficiency GaAs MCM Power Amplifier for 1.9GHz Digital Cordless Telephones," IEE 1994 Microwave and Multimeter–Wave Monolithic Circuits Symposium, 1994, pp. 51–54.

V. K. Varadan, K. A. Jose, V. V. Varadan, "Design and Development of Electronically Tunable Microstrip Antennas," IOP Publishing Ltd., 1999, pp. 238–242.

Communication Relating to the Results of the Partial International Search: PCT/IB 02/01077 (2002).

International Search Report: PCT/IB 02/01086 (Jun. 24, 2002).

International Search Report: PCT/IB 02/01078 (Jul. 10, 2002).

International Search Report: PCT/IB01087 (Jul. 19, 2002).

International Search Report: PCT/IB 02/01107 (Jul. 11, 2002).

International Search Report: PCT/IB 02/01120 (Jul. 11, 2002).

International Search Report: PCT/IB 02/01098 (Jul. 4, 2002).

International Search Report: PCT/IB 02/01082 (Jul. 8, 2002).

International Search Report: PCT/IB 02/01144 (Jul. 12, 2002).

International Search Report: PCT/IB 02/01026 (Jun. 28, 2002).

International Search Report: PCT/IB 02/01027 (Jun. 25, 2002).

* cited by examiner

BAND SWITCHABLE FILTER

RELATED APPLICATIONS

This application claims the benefit of U.S. Provisional Application No. 60/283,093, filed Apr. 11, 2001 now abandoned, which is hereby incorporated by reference. In addition, this application relates to the following U.S. applications, which are hereby incorporated by reference: Ser. No. 09/904,631 filed on Jul. 13, 2001, by Stanley S. Toncich entitled "Ferro-Electric Tunable Filter"; Ser. No. 09/912,753 filed on Jul. 24, 2001 by Stanley S. Toncich entitled "Tunable Ferro-Electric Multiplexer"; Ser. No. 09/927,732 filed on Aug. 8, 2001, by Stanley S. Toncich entitled "Low Loss Tunable Ferro-Electric Device and Method of Characterization"; Ser. No. 09/927,136 filed on Aug. 10, 2001, by Stanley S. Toncich entitled "Tunable Matching Circuit"; Ser. No. 10/044,522 filed on Jan. 11, 2002, by Stanley S. Toncich entitled "Tunable Planar Capacitor"; Ser. No. 10/077,654 filed on Feb. 14, 2002, by Stanley S. Toncich entitled "Tunable Isolator Matching Circuit"; Ser. No. 10/076,171 filed on Feb. 12, 2002, by Stanley S. Toncich entitled "Antenna Interface Unit"; Ser. No. 10/075,896 filed Feb. 12, 2002, by Stanley S. Toncich entitled "Tunable Antenna Matching Circuit"; Ser. No. 10/075,727 filed Feb. 12, 2002, by Stanley S. Toncich and Tim Forrester entitled "Tunable Low Noise Amplifier"; Ser. No. 10/075,507 filed on Feb. 12, 2002, by Stanley S. Toncich entitled "Tunable Power Amplifier Matching Circuit".

BACKGROUND

In many communication applications full duplex transmit/receive (TX/RX) operation is required. One such application is in the implementation of the CDMA communication standard. A more specific application is in the area of wireless handsets and PCM/CIA cards in computers, which implement the CDMA standard.

Often one desires to implement a multi-band communication system. A typical example is a dual band wireless handset where the two bands implemented are the U.S. cellular (typically 800–1000 MHz) and U.S. PCS (typically 1800–2000 MHz). A current radio frequency (RF) realization of such architecture employs entire, separate TX and RX chains for the RF. This realization is driven by the rather wide separation of the two bands along with the fact that most of the components used are by necessity narrow band devices. Specifically, these narrow band devices include, but are not limited to, band pass filters (BPF's), power amplifiers (PA's) and duplexers used for either band.

Basic building blocks of present day dual band wireless CDMA handsets are BPF's and duplexers based on electromagnetic (em) resonators. Examples are short circuit monoblock and stripline filters, which support transverse electromagnetic (TEM) waves. They have an added advantage in that they're physically short as well as being relatively simple structures to fabricate. Others are surface acoustic wave (SAW) or film bulk acoustic resonator (FBAR) technologies. The relative merits and limitations of SAW and FBAR devices are well known to those skilled in the art. In all cases (TEM or acoustic resonator) the resultant filters or duplexers must meet tight specifications in their designated bands. Going to multiple bands conventionally requires using multiplexers in place of duplexers or multiple duplexers with multiplexers following them or the use of switches to select desired bands. Any of these options take up precious board space, add cost and complexity to the system.

The advantages of using ferro-electric (f-e) based components to design and fabricate low order, high performance filters have been outlined in U.S. patent application Ser. Nos. 09/904,631; 09/912,753; and 09/927,732. F-E tuning is limited, however, to a relatively narrow band around a desired operating frequency if the lowest possible insertion loss (I.L.) is desired. The requirement for minimum I.L. in wireless CDMA systems has also been discussed previously and will not be repeated here. F-e tuning as it applies in this application will be directed to its use with em resonators, such as, for example, monoblock, stripline and coaxial resonator-based devices. As is known to those skilled in the art, lumped elements (discrete inductors and capacitors) can be used at appropriate lower frequencies or at higher frequencies where the added loss inherent to lumped element components can be tolerated.

The need to use two distinct RF architectures to realize two distinct bands is unfortunate, as it significantly increases cost and pwb board area required to realize the design. The need to specify and carry two sets of components further adds to cost and overhead. Clearly, if one wanted to realize say three, or more bands, the problems of increased cost, size and signal interference would make the attempted realization prohibitive, especially in high volume.

It would be advantageous if one could design a dual band (or higher) system with one set of components rather than using two (or more) sets.

SUMMARY

Wireless communication systems require highly selective frequency filtering of wireless communications signals. Filters occupy a significant percentage of wireless communication device space. Additionally, the process of filtering a signal results in the attenuation of the desired signal. That is, power is consumed by filters in the process of selecting the correct frequency band for transmission or reception. This power consumption is known as insertion loss (I.L.). This results in increased power consumption in the case of transmission and decreased sensitivity in the case of reception. This results in decreased talk time and a possibly degraded communication link.

Also, wireless communications devices commonly operate in multiple frequency bands. Typically, different filters are required for each frequency band. Thus, multiple filters consume even more space in a wireless communication device. Finally, filters comprise a significant portion of the cost of a wireless communication device.

Accordingly, a novel filter is provided with excellent performance in terms of out-of-band rejection and in band insertion loss. The filter is tunable over a range of frequencies and switchable over a broader range of frequencies. Preferably, the filter is smaller than those known in the prior art. Thus, a single filter can be used for multiple frequency bands, replacing multiple filters in a prior art system.

Thus, the filter accomplishes the filtering of wireless communication signals, while occupying less space than previous filters. Also, the filter costs less than previously known filters. Additionally, talk times and standby times are increased over wireless communication devices operating with previously known filters.

One technique for doing this involves the design of dual band BPF's and duplexers based on micro-electro mechanical system (MEMS) switches used in conjunction with f-e tunable low order, narrow band BPF's. This approach reduces the size and cost of the required parts by eliminating one (or more) set(s) of components. Using a similar approach for PA's and LNA's allows their use in covering two (or more) widely separated bands in frequency. Band switchable power amplifiers and lower noise amplifiers are discussed in U.S. patent application Ser. Nos. 10/075,727, 10/076,171, and 10/075,507. Thus, one may realize a multiband electronic communication system without the need to introduce redundant parts or electronic switches.

DETAILED DESCRIPTION OF PREFERRED EMBODIMENTS

Figure 1:
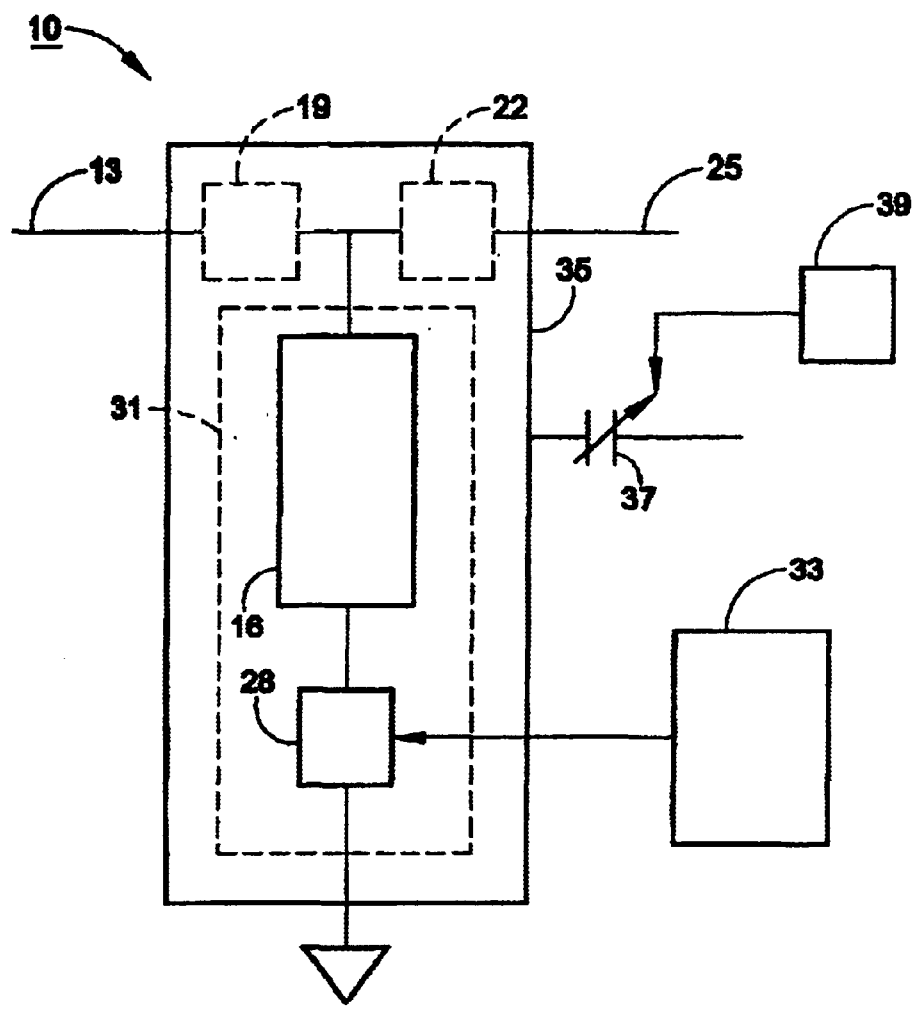
FIG. 1 is a schematic diagram of a first order tunable, switchable filter.

Referring now to FIG. 1, a tunable, switchable electromagnetic signal filter 10 is shown. The tunable, switchable filter 10 can switch from one band to another, even when the bands are far apart in terms of frequency. An input port 13 is coupled to a resonator 16. The resonator 16 a stripline resonator, a monoblock resonator, or any other type electromagnetic resonator that is known in the art. The resonator 16 is also coupled to either input impedance element 19 or output impedance element 22, or to both input and output impedance elements 19 and 22. The impedance elements 19 and 22 may be lumped element capacitors or inductors, integrated capacitors or inductors, or any other type impedance element known in the art. Either the output impedance element 22 or the input impedance element 19 and the resonator 16 are coupled to an output port 25.

The resonator 16 is coupled to a MEMS switch 28, which is coupled to ground. The resonator 16 and MEMS switch 28 together form a switchable resonator 31. As is also well known in the art, MEMS switches generally have two states: open and closed. In the open state, a typical MEMS switch behaves like a numerically small valued capacitor with a capacitance less than about 0.1 pF. This depends on geometrical factors. This is an effective open for most practical purposes. In the closed (short circuit) state, a typical MEMS switch has a resistance equal to about 0.01 ohms. This is not always a negligible resistance, as will be discussed below. However, a tunable switchable filter may still be advantageous even if there are reasons to use a MEMS switch with a higher short circuit resistance than 0.01 ohm.

In the open state, the MEMS switch 28 de-couples the resonator 16 from ground. The resonator 16 is not coupled to anything in this state. The switchable resonator 31 is a half wave resonator in this state which behaves as a series L-C circuit, as is well known in the art. Because one end of the switchable resonator 31 is open, its primary resonance frequency is the frequency that has a wavelength equal to two times the electrical length of the switchable resonator 31.

In the closed state, the MEMS switch 28 couples the resonator 16 to ground. In this state, the switchable resonator 31 is a quarter wave resonator which behaves as a parallel L-C resonator, as is well known in the art. Because one end of the switchable resonator 31 is grounded, its primary resonance frequency is the frequency that has a wavelength equal to four times the electrical length of the switchable resonator 31. The MEMS switch has a non-negligible resistance, so it adds to the resonator's loss. Thus, the loss of the MEMS switch in the closed position is critical to achieving a low I.L.

Together, the impedance elements 19 or 22 or both, and the switchable resonator 31 make a switchable first order filter 35. A switching control signal generator 33 controls the switching of the MEMS switch 28. By switching the MEMS switch 28 from open to closed states, the switching control signal generator 33 makes the switchable filter 35 switch between two frequencies that are a factor of two apart, in frequency. For example, the switchable filter 10 may select a signal at 800 MHz when the MEMS switch 28 is closed. Then, when the MEMS switch 28 was open, the switchable filter 10 would select a signal at two times 800 MHz, or 1600 MHz. Thus, one filter can advantageously be used to select two different signals that are a factor of two apart, in frequency.

A ferroelectric tunable capacitor 37 is coupled to the switchable filter 35. The ferroelectric tunable capacitor 37 is shown coupled to an abritrary point on the switchable filter 35. The ferroelectric tunable capacitor can be connected to the switchable filter at many different points, in many different ways, some of which are described below. The ferroelectric tunable capacitor 37 modifies the electrical length of the switchable filter 35. The amount that it modifies the electrical length of the switchable filter is determined by the capacitance that the capacitor 37 is tuned to as well as the electrical length of the resonator used.

A tuning control signal generator 39 is coupled to the ferroelectric tunable capacitor 37. The tuning control signal generator 39 generates a tuning control signal for tuning the ferroelectric tunable capacitor 37. Thus, whether the MEMS switch is open or closed, the ferroelectric tunable capacitor tunes the selection frequency of the tunable, switchable filter 10.

Figure 2:
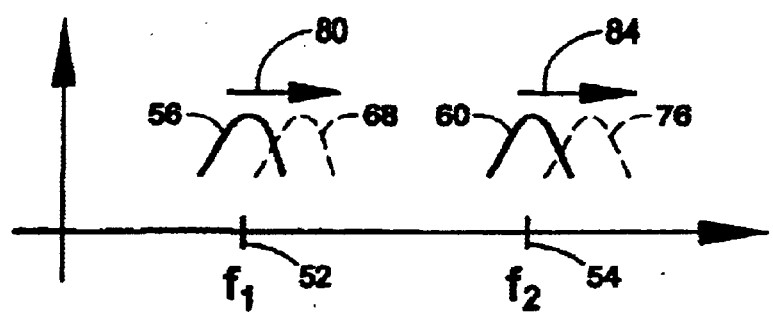
FIG. 2 is a graph of a frequency response of a tunable, switchable filter.

The frequency switching and tuning will now be described with reference to FIG. 2. FIG. 2 is a plot of the frequency response of the filter 10 of FIG. 1 versus frequency. A lower zero bias frequency f1 52 is shown. The filter 10 operates at or near f1 when the MEMS switch 28 is closed. This is when the resonator 31 is operating as a quarter wave resonator. The frequency response for quarter waver resonator operation at zero bias is shown as solid line 56.

A higher zero bias frequency f2 54 is shown. The filter 10 operates at or near f2 when the MEMS switch 28 is open. This is when the resonator 31 is operating as a half wave resonator. The frequency response for half wave resonator operation at zero bias is shown as solid line 60.

Ferroelectric tunable capacitor 37 shifts the frequency responses of filter 10. The tuned frequency response for quarter wave resonator operation is shown as dashed lines 68. The tuned frequency response for half wave resonator operation is shown as dashed line and 76. The frequency response is switched discretely between tuning range f1 and f2, but tuned continuously from frequency response 56 to frequency response 68, or from frequency response 60 to frequency response 76. Arrows 80 and 84 indicate the continuous tunability of the frequency responses.

Tuned frequency responses 64 and 68 are shown at lower and higher frequencies, respectively, than zero bias frequency response 56. Generally, tuned frequency responses will be at either lower or higher frequencies than the zero bias frequency response, but not both. Preferably, as will be described below with reference to FIG. 3, the ferroelectric tunable capacitor is coupled to the switchable filter in such a way that the zero bias frequency response is the lowest frequency response for a given MEMS switch setting.

To cover non-adjacent bands like the U.S. cellular and U.S. PCS bands, for example, one must modify the structure of the underlying TEM resonator structure. Consider the case of a short circuit stripline or monoblock BPF operating in the cell band. If one could open circuit the resonators, the resonant frequency would double. Further modification in the resonant frequency, using f-e tuning capacitors as one concrete example, would allow the filter (or duplexer) to be tuned beyond the doubling in frequency obtained by open circuiting the resonator.

To further expand on the cellular to PCS band switching, consider that the U.S. cellular band extends from 824 to 849 MHz (TX) and 869 to 894 MHz (RX). The full U.S. PCS band extends from 1850 to 1910 MHz (TX) and 1930 to 1990 MHz (RX). To cover both bands, a band-switchable, tunable TX BPF must cover 824 to 849 MHz, then switch to 1850 to 1910 MHz for PCS. A similar argument can be made for the corresponding RX bands. For this application, f-e capacitors are chosen to "fine tune" within both bands, while the MEMS switch is used to select between the bands.

A preferred embodiment of a tunable, switchable filter will now be described with reference to FIG. 3. FIG. 3 is a schematic diagram of a double pole tunable, switchable filter 77. FIG. 3 shows the schematic of the circuit along with the required f-e tuning capacitors. The filter 77 shown in FIG. 3 is similar to the filter 10 shown in FIG. 1. The primary difference is that there are two resonators 79 and 83 in the double pole filter 77 of FIG. 3. The resonators 79 and 83 may be coaxial resonators, monoblock resonators, stripline resonators, microstrip resonators, or any other type of resonator that is known in the art. Preferably, the resonators 79 and 83 are monoblock resonators, with electomagnetic coupling between them. Electromagnetic coupling is represented in FIG. 3 as arrow 87.

Switching resonators 79 and 83 between full and half wave modes is provided by MEMS switches 91 and 95, in a similar manner to that described with reference to FIG. 1. A switching control signal generator (not shown) provides the control signal for MEMS switches 91 and 95.

Regarding the ferroelectric tunability, this is provided by tunable ferroelectric capacitors 103, 107 and 109. Capacitors 99, 105, 119 and 121 may optionally be ferroelectric tunable capacitors. Filter 77 is similar to filters described in U.S. patent application Ser. No. 09/904,631. Top coupling capacitor 103 is an admittance inverter. By making capacitor 103 tunable, it provides for a tunable zero while maintaining a desirable filter response shape. This is useful for communications in which transmit and receive signals are on nearby frequencies, such as CDMA, particularly PCS or cellular CDMA communications at about 1900 MHz and about 800 MHz respectively. The PCS and cellular CDMA frequency bands are well known in the art. In these communication schemes, transmit and receive bands are very close together.

Capacitor 103, in conjunction with mutual coupling 87, provides for a zero in the transmit filter frequency response. By careful selection of capacitance of capacitor 103, the zero can be located in the receive band. Importantly, this reduces interference of the transmit signal with the receive signal. But if capacitor 103 were of a fixed capacitance, the zero produced by capacitor 103 would not tune appropriately with the pass band of filter 77. Preferably, capacitor 103 is a ferroelectric tunable capacitor. This allows for tuning of the zero in step with the tuning of the pass band of filter 77.

Ferroelectric tunable capacitors 107 and 109 tune the pass band, as described in U.S. patent application Ser. No. 09/904,631. Capacitors 107 and 109 are tuned by means of tuning control signal generators 111 and 113, shown as voltage sources in FIG. 3. Resistors 115 and 117 are coupled between voltage sources 111 and 113 for supplying a voltage to tuning capacitors 107 and 109. Direct current (DC) blocking capacitors 119 and 121 are provided for blocking the DC voltage provided by voltage sources 111 and 113 from coupling directly to ground.

Input capacitor 99 and output capacitor 105 may also be tunable ferroelectric capacitors. In this way, the input impedance and output impedance, respectively, can be tuned as the pass band is tuned and switched. Preferably, the input impedance and output impedance is tuned to remain constant at different frequencies of operation.

Figure 3A:
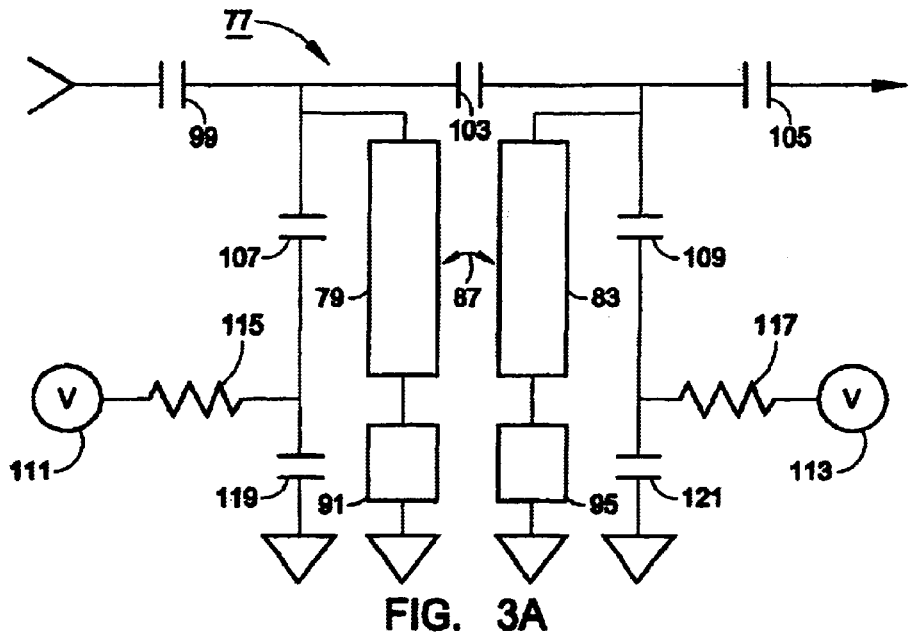
FIG. 3A is a schematic diagram of a second order tunable, switchable filter.
Figure 3B:
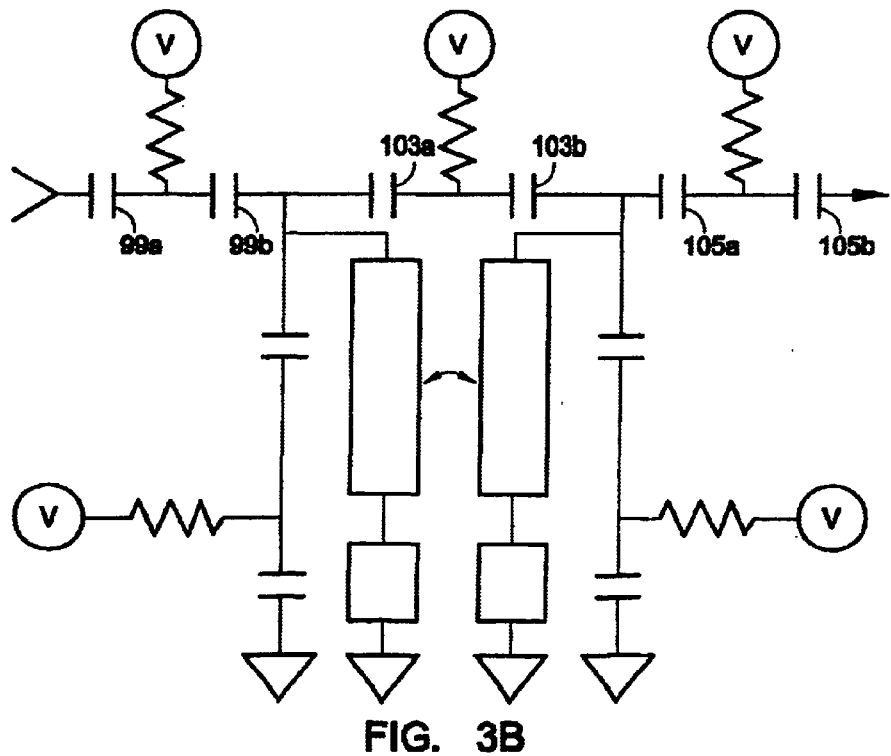
FIG. 3B is a schematic diagram of a second order tunable, switchable filter.

The tunability for capacitors 103, 99 and 105 may be provided by splitting capacitors 103, 99 and 105 each into a pair of capacitors 103a and 103b; 99a and 99b; and 105a and 105b, respectively, as shown in FIG. 3B. The series capacitors 103a and 103b have an equivalent capacitance to capacitor 103. The series capacitors 99a and 99b have an equivalent capacitance to capacitor 99. The series capacitors 105a and 105b have an equivalent capacitance to capacitor 105. Voltage sources 100, 104 and 106 are applied between each of the pairs of the capacitors 103a and 103b; 99a and 99b; and 105a and 105b. The voltage sources 100, 104, and 106 can be the same voltages sources as voltage sources 115 and 113.

A preferred topology for a double pole filter as described with reference to FIG. 3 will now be described. A concrete example is given here, based on using a 4.0 mm (0.160 inches) tall $2^{nd}$ order monoblock BPF as the em resonator structure. The ceramic material is commercially available Trans Tech, Inc. TT8800 with a dielectric constant of 38.6; loss tangent of 0.00016, configured in a top capacitively coupled BPF topology. Each of the components preferably has the values listed in Table 1. Reference numerals refer to FIG. 3A.

TABLE 1

| Item # | Component | Parameter | Value |
|---|---|---|---|
| 1 | Capacitor 99 | Zero bias capacitance | 0.96 picofarads (pF) |
| 2 | Capacitor 105 | Zero bias capacitance | 0.96 pF |
| 3 | Capacitor 103 | Zero bias capacitance | 0.74 pF |
| 4 | Capacitor 107 | Zero bias capacitance | 4.05 pF |
| 5 | Capacitor 109 | Zero bias capacitance | 4.05 pF |
| 6 | Resistor 115 | Resistance | 1.0 megaohms (Mohm) |

TABLE 1-continued

| Item # | Component | Parameter | Value |
|---|---|---|---|
| 7 | Resistor 117 | Resistance | 1.0 megaohms (Mohm) |
| 8 | MEMS Switch 91 | Impedance, closed | 0.01 ohm |
| 9 | MEMS Switch 95 | Impedance, closed | 0.01 ohm |
| 10 | MEMS Switch 91 | Impedance, open | 0.1 Mohm |
| 11 | MEMS Switch 95 | Impedance, open | 0.1 Mohm |
| 12 | Capacitor 119 | Capacitance | 390 pF |
| 13 | Capacitor 121 | Capacitance | 390 pF |
| 14 | Resonator 79 | Center conductor diameter | 36 thousands of an inch (mil) |
| 15 | Resonator 83 | Center conductor diameter | 36 mil |
| 16 | Resonator 79 | Length | 412 mil |
| 17 | Resonator 83 | Length | 412 mil |
| 18 | Resonators 79 & 83 | Spacing between center conductors | 65 mil |

Simmulations of the circuit described with reference to FIG. 3A and Table 1 were preformed. The simulations were performed using the commercially available software, Eagleware. Simulation results are shown in FIGS. 4–7. The ferroelectric capacitor tuning parameters and MEMS switch switching parameter for each configuration shown in FIGS. 4–7 are shown in Table 2.

TABLE 2

| Item # | FIGURE # | Band | Ferroelectric capacitor bias state | MEMS switch state | Bound within band |
|---|---|---|---|---|---|
| 1 | 4 | PCS | Medium bias | Open | Lower bound |
| 2 | 5 | PCS | High bias | Open | Higher bound |
| 3 | 6 | Cellular CDMA | Zero bias | Closed | Lower bound |
| 4 | 7 | Cellular CDMA | Minimal bias | Closed | Higher bound |

Four different ferroelectric capacitor bias states are shown in Table 2. The states represent the bias levels on capacitors 103, 107 and 109 and optionally 99 and 105. Each of the ferroelectric capacitors has a different bias state based on the band and the bound within the band. These states are chosen to show the bounds of the bias range for PCS and cellular CDMA. The ferroelectric capacitors could be tuned continuously within each band, PCS and cellular CDMA. Medium bias state is used for the lower bound of the PCS band. High bias state is used for the higher bound of the PCS band. Zero bias state is used for the lower bound of the cellular CDMA band. Minimal bias state is used for the higher bound of the cellular CDMA band. The tuning requirements for each capacitor in the different bias states are shown in Table 3. The PCS values are for when MEMS switches 91 and 95 are open. MEMS switches 91 and 95 are assumed to have an approximate open state capacitance of 0.1 pF. If switches are used with different values of open state capacitance, adjustments to the capacitances in Table 3 will be necessary.

TABLE 3

| Item # | Capacitor # | Ferroelectric capacitor bias state | Capacitance | % tuning required |
|---|---|---|---|---|
| 1 | 99 and 105 | Medium bias | 0.574 pF | 40.2 |
| 2 | 103 | Medium bias | 0.462 pF | 37.6 |
| 3 | 107 and 109 | Medium bias | 2.68 pF | 33.8 |

TABLE 3-continued

| Item # | Capacitor # | Ferroelectric capacitor bias state | Capacitance | % tuning required |
|---|---|---|---|---|
| 4 | 99 and 105 | High bias | 0.513 pF | 46.6 |
| 5 | 103 | High bias | 0.366 pF | 50.5 |
| 6 | 107 and 109 | High bias | 2.08 pF | 48.6 |
| 7 | 99 and 105 | Zero bias | 0.96 pF | Zero |
| 8 | 103 | Zero bias | 0.74 pF | Zero |
| 9 | 107 and 109 | Zero bias | 4.05 pF | Zero |
| 10 | 99 and 105 | Minimal bias | 0.914 pF | 4.8 |
| 11 | 103 | Minimal bias | 0.65 pF | 12.2 |
| 12 | 107 and 109 | Minimal bias | 3.56 pF | 12.1 |

Figure 4:
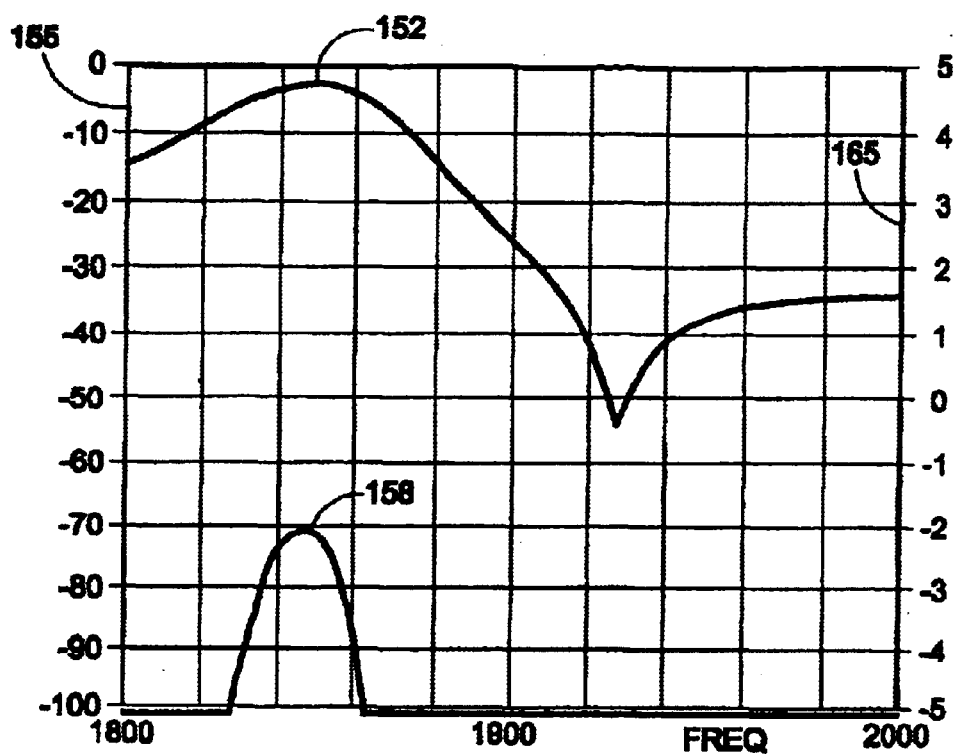
FIG. 4 is a graph of a frequency response of a tunable, switchable filter centered at 1850 MHz.

FIG. 4 shows simulation results of the filter response of the filter 77 described with reference to FIG. 3A for operation in the PCS band at the lower bound. The lower bound of the PCS band is shown at 1850 MHz. The upper response curve 152 is plotted on the left hand vertical axis 155 with a scale of −100 dB to 0 dB. The lower response curve 158 is a blown up version of the upper response curve 152. The blown up version 158 is plotted on the right hand vertical axis 161 with a scale of −5 dB to +5 dB. The insertion loss, as measured at point 5b, is −2.385 dB. This is the value of point 5b on the right hand vertical axis 165.

Figure 5:
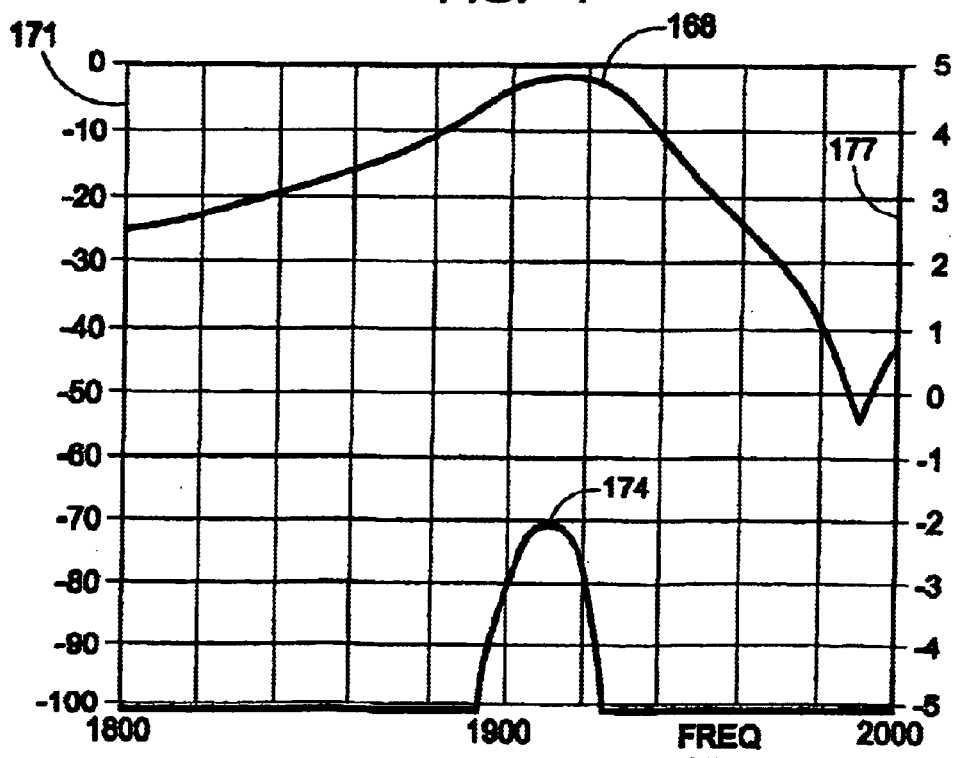
FIG. 5 is a graph of a frequency response of a tunable, switchable filter centered at 1910 MHz.

FIG. 5 shows simulation results of the filter response of the filter 77 described with reference to FIG. 3 for operation in the PCS band at the higher bound. The higher bound of the PCS band is shown at 1910 MHz. The upper response curve 168 is plotted on the left hand vertical axis 171 with a scale of −100 dB to 0 dB. The lower response curve 174 is a blown up version of the upper response curve 168. The blown up version 174 is plotted on the right hand vertical axis 177 with a scale of −5 dB to +5 dB. The insertion loss, as measured at point 6b, is −2.478 dB. This is the value of point 6b on the right hand vertical axis 177.

Figure 6:
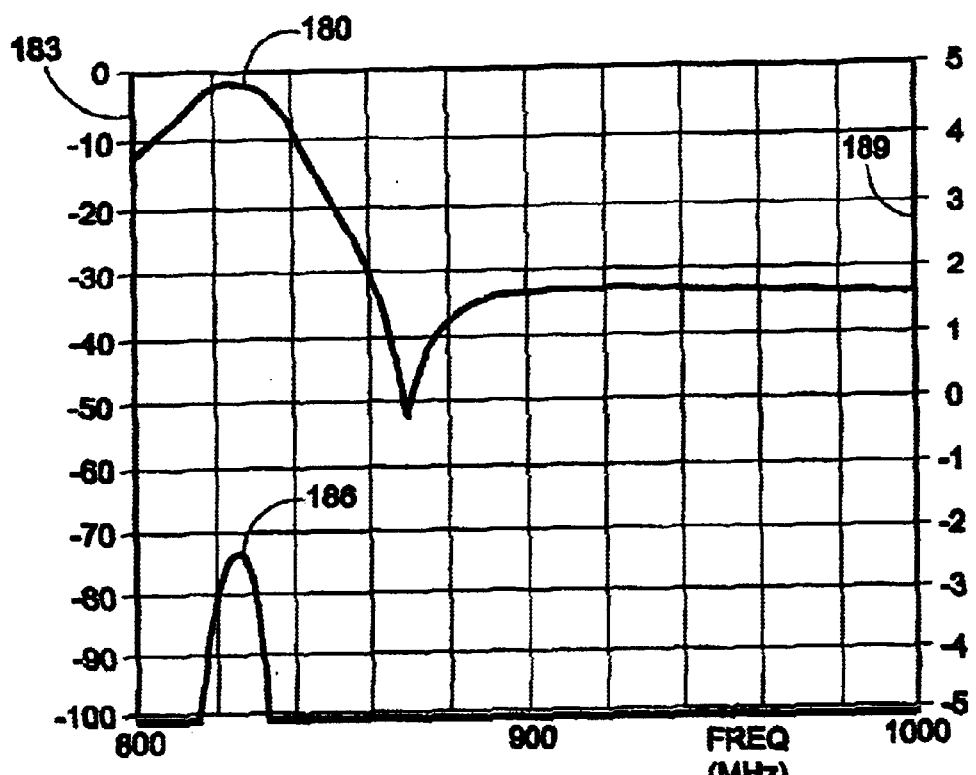
FIG. 6 is a graph of a frequency response of a tunable, switchable filter centered at 824 MHz.

FIG. 6 shows simulation results of the filter response of the filter 77 described with reference to FIG. 3A for operation in the cellular CDMA band at the lower bound. The lower bound of the cellular CDMA band is shown at 824 MHz. The upper response curve 180 is plotted on the left hand vertical axis 183 with a scale of −100 dB to 0 dB. The lower response curve 186 is a blown up version of the upper response curve 180. The blown up version 186 is plotted on the right hand vertical axis 189 with a scale of −5 dB to +5 dB. The insertion loss, as measured at point 1b, is −2.861 dB. This is the value of point 1b on the right hand vertical axis 189.

Figure 7:
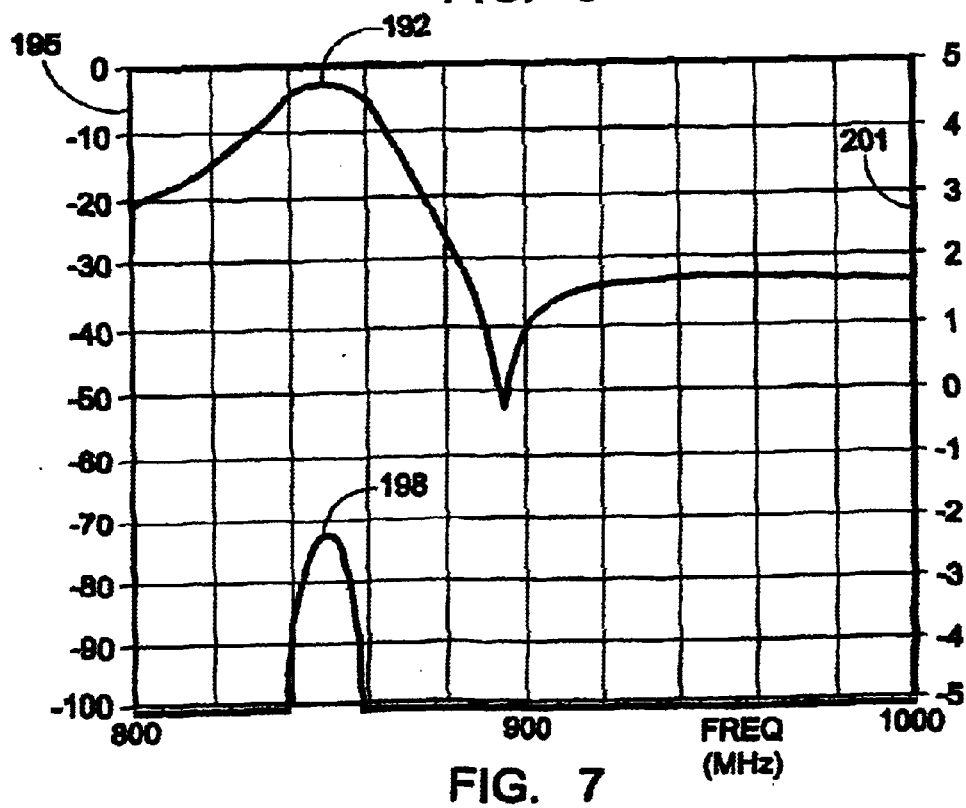
FIG. 7 is a graph of a frequency response of a tunable, switchable filter centered at 849 MHz.
Figure 8:
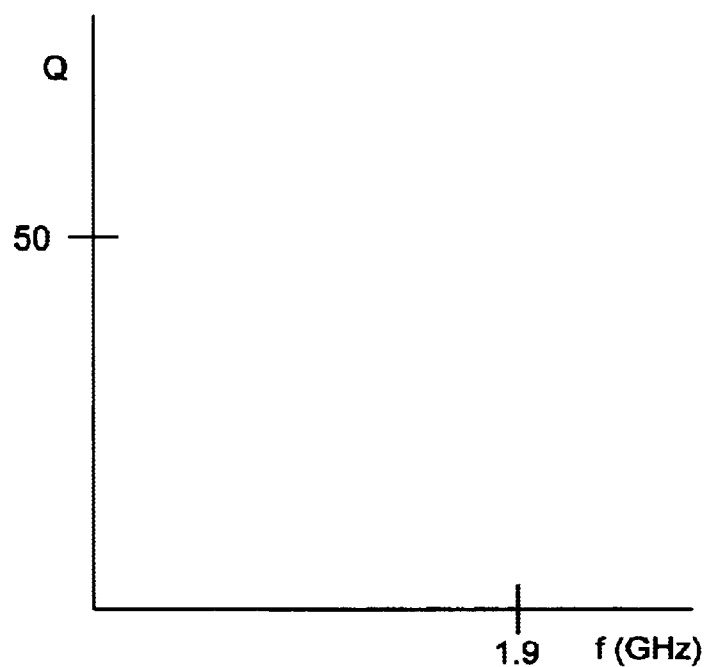
FIG. 8 is a graph showing Q at a frequency of 1.9 GHz for the filter of the present invention.

FIG. 7 shows simulation results of the filter response of the filter 77 described with reference to FIG. 3A for operation in the cellular CDMA band at the higher bound. The higher bound of the cellular CDMA band is shown at 849 MHz. The upper response curve 192 is plotted on the left hand vertical axis 195 with a scale of −100 dB to 0 dB. The lower response curve 198 is a blown up version of the upper response curve 192. The blown up version 198 is plotted on the right hand vertical axis 201 with a scale of −5 dB to +5 dB. The insertion loss, as measured at point 2b, is −2.769 dB. This is the value of point 2b on the right hand vertical axis 201.

Figure 3C:
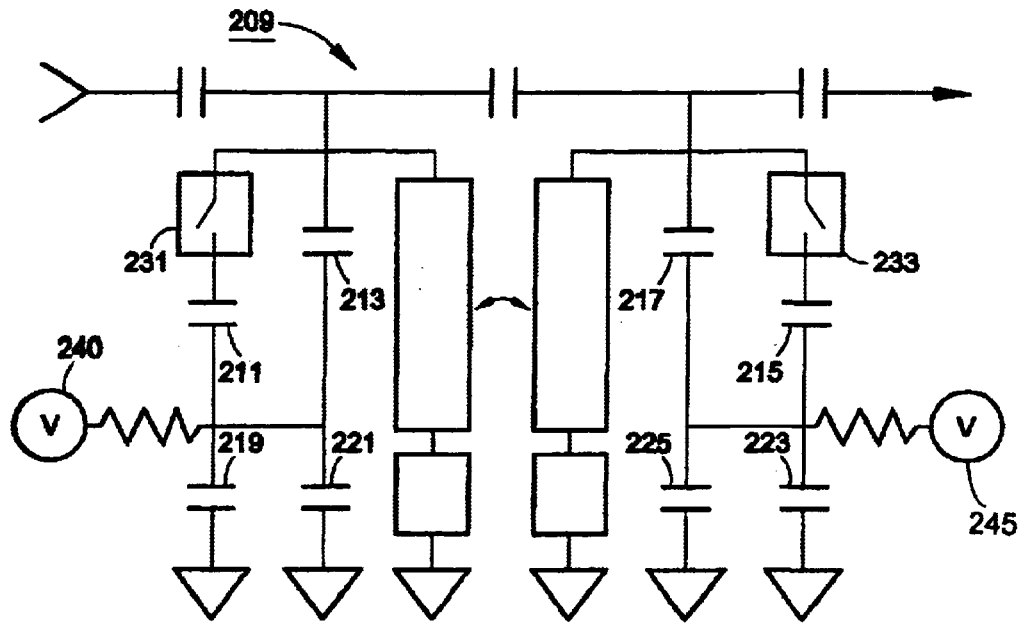
FIG. 3C is a schematic diagram of a second order tunable, switchable filter.
Figure 3D:
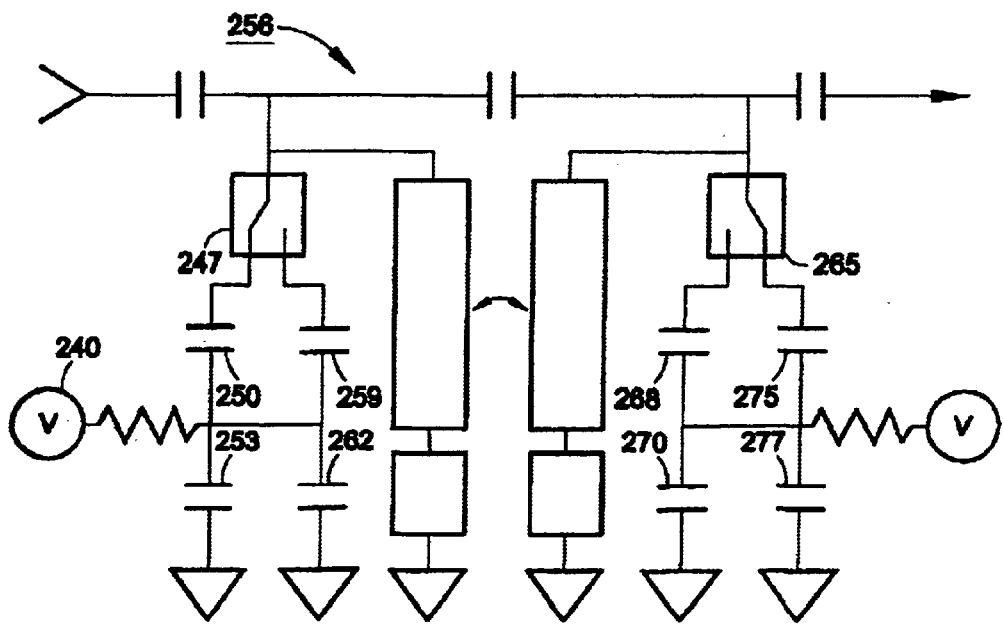
FIG. 3D is a schematic diagram of a second order tunable, switchable filter.

This design example shows f-e tuning over both cellular and PCS bands using one continuous dc voltage source applied through resistors 115 and 117, referring to FIG. 3A. Another variation of this approach would be to use extra MEMS switches to switch out the cellular band f-e tuning capacitors and switch in a set of PCS band f-e tuning capacitors. While adding to the complexity of the system, it would reduce the capacitance change required for tuning in either band as well as allowing for greater control in either band. This can be accomplished in many ways. Two examples are shown in FIGS. 3C and 3D. FIG. 3C shows tunable, switchable filter 209, similar to the tunable, switchable filter 77 described with reference to FIG. 3A. The filter 209 has additional capacitors 211 and 213 replacing capacitor 113, additional capacitors 215 and 217 replacing capacitor 115, additional capacitors 219 and 221 replacing capacitor 107, and additional capacitors 223 and 225 replacing capacitor 109. A MEMS switch 231 couples capacitors 211 and 219 to the filter 209. When MEMS switch 231 is open, capacitors 211 and 219 are uncoupled from filter 209. When MEMS switch 231 is closed, capacitors 211 and 219 are coupled to the filter 209. Similarly, MEMS switch 233 couples and uncouples capacitors 215 and 223 to the filter 209. Capacitors 213, 221, 217, and 225 are not uncoupled from the filter 209 by MEMS switches 231 and 233. Thus, MEMS switches 231 and 233 only add capacitors 211, 219, 215 and 223 in parallel to existing capacitors 213, 221, 217 and 225, rather than switching out capacitors 213, 221, 217 and 225.

Voltage sources 240 and 245 supply tuning voltages to f-e tunable capacitors 211, 213, 215 and 217. Capacitors 219, 221, 223, and 225 are DC blocking capacitors.

In operation, MEMS switches 231 and 233 are preferably closed for selecting a signal at a lower frequency, such as, for example, at about 800 MHz. Preferably, MEMS switches 231 and 233 are open for selecting a signal at a higher frequency, such as, for example, at about 1900 MHz.

Alternatively, MEMS switches can be configured to switch between sets of capacitors, rather than just switching in or out one set of capacitors. This configuration is shown in FIG. 3D. In one state of MEMS switch 247, capacitors 250 and 253 are coupled to the filter 256 and capacitors 259 and 262 are not. Thus, MEMS switch 247 switches between capacitors 250 and 253 in one state and capacitors 259 and 262 in the other state. MEMS switch 265 similarly couples capacitors 268 and 270 to filter 256 in one state and couples capacitors 275 and 277 to filter 256 in another state.

Figure 3E:
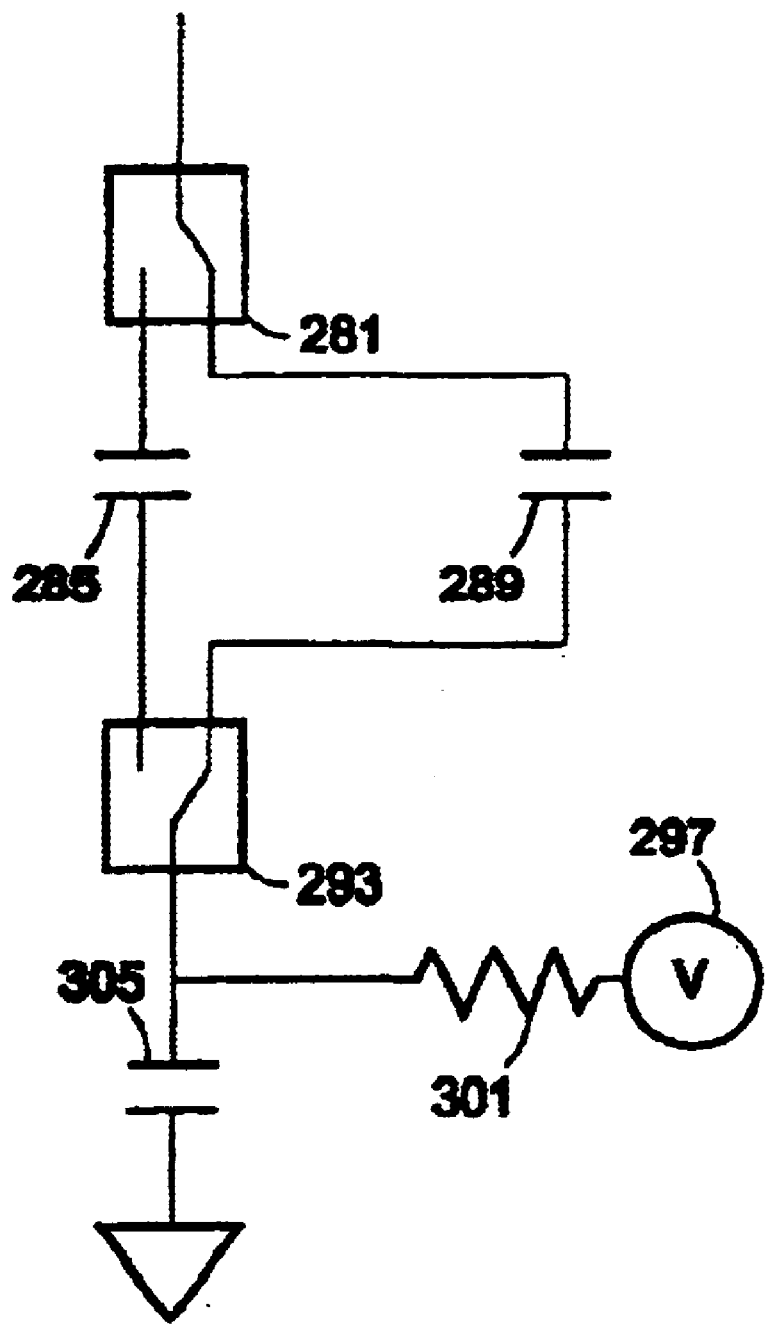
FIG. 3E is a schematic diagram of a portion of a tunable switchable filter.

Alternatively, MEMS switches can be used to switch in or out just the ferroelectric capacitors 211, 215, 250, 259, 268 and 275 of FIGS. 3C and 3D. This can be accomplished as shown in FIG. 3E. FIG. 3E is a schematic diagram of a portion of a switchable, tunable filter. The portion shown in FIG. 3E can replace capacitors 109 and 121, resistor 117 and voltage source 113 shown in FIG. 3A. Referring again to FIG. 3E, MEMS switch 281 couples to a resonator. Capacitors 285 and 289 are ferroelectric capacitors, similar in function to capacitor 109. MEMS switch 293 also couples to capacitors 285 and 289. Together, MEMS switches 281 and 293 couple either capacitor 285 or 289 to the filter. Voltage source 297 provides a tuning voltage to capacitor 285 and 289, through resistor 301. Capacitor 305 provides DC blocking. Similar switching can be provided for any of the ferroelectric capacitors shown in FIGS. 3A–3D. The advantage of the configuration shown in FIG. 3E is that fewer DC blocking capacitors are required. The advantage of the configuration shown in FIGS. 3C and 3D is that fewer MEMS switches are required.

Referring again to FIG. 3A, similar switching mechanisms and similar additional capacitors as described with reference to FIGS. 3C, 3D and 3E can be employed for switching capacitors 99, 103 and 105. This enables switching between frequency bands that are far apart while maintaining small ranges of tunability for each f-e tunable capacitor.

In normal wireless handset operation, one will make calls in either cellular or PCS band. Switching between bands during a call is not required. Thus the switching time between open and short circuit is not critical. A reasonable switching time is less than about 20 milliseconds.

MEMS devices can achieve the required low value of dc resistance if they are correctly designed. This requires a large area metal contact surface with adequate metal thickness. The design of such a MEMS device is well known to those skilled in the art. Direct fabrication or integration of the MEMS device is key to achieving the lowest possible pass band I.L. The use of packaged MEMS devices will add to the loss, degrading performance. The added loss will be in the form of attachment loss, as discussed in U.S. patent application Ser. No. 09/927,732.

While a ceramic monoblock design is presented here, it is clear that other topologies, notably stripline or microstrip can be feasible. The choice of topology, along with the method of introducing the MEMS switch will be determined by the specific application along with the ability of a given system design to tolerate loss.

While a single TX band BPF design is presented here, clearly the concept can be expanded to an RX BPF covering the U.S. cell and PCS bands. Further, the concept can be applied to other non-adjacent bands as well. This includes covering the GPS and India and Korea PCS bands, which lie below the U.S. PCS band in frequency, with the design presented here.

It will further be understood that these benefits can be utilized to improve wireless communication devices in ways other than those mentioned here.

What is claimed is:

1. A tunable, switchable electromagnetic filter comprising:
   an electromagnetic resonator;
   a switch coupled to the resonator and to ground;
   an impedance element coupled to the resonator, wherein the resonator, the switch and the impedance element comprise a switchable filter;
   a ferroelectric tunable component electromagnetically coupled to the switchable filter and comprising a ferroelectric capacitor having a quality factor at about 1.9 GHz equal to about 50 or greater;
   a tuning control signal generator for generating a tuning signal, coupled to the ferroelectric tunable component;
   a switching control signal generator for generating a switching signal, coupled to the switch.

2. A tunable, switchable electromagnetic filter comprising:
   an electromagnetic resonator;
   a switch coupled to the resonator and to ground;
   an impedance element coupled to the resonator, wherein the resonator, the switch and the impedance element comprise a switchable filter;
   a ferroelectric tunable component electromagnetically coupled to the switchable filter;
   a tuning control signal generator for generating a tuning signal, coupled to the ferroelectric tunable component;
   a switching control signal generator for generating a switching signal, coupled to the switch, wherein the filter resonates in a half wave mode.

3. A method of modifying a resonant frequency of a filter comprising:
   resonating a resonator in a first operating mode, the resonator being coupled to a MEMS switch;

generating a switching control signal;

switching a state of the MEMS switch, responsive to the switching control signal;

changing a grounding condition of a port of the resonator, responsive to the state of the MEMS switch;

producing a second operating mode of a resonator, responsive to the grounding condition;

generating a tuning control signal;

varying an impedance of a ferroelectric component, responsive to the tuning control signal;

adjusting a resonance frequency of the resonator, responsive to the impedance of the ferroelectric component.

* * * * *